US008438462B2

(12) United States Patent
Liva

(10) Patent No.: US 8,438,462 B2
(45) Date of Patent: May 7, 2013

(54) METHOD FOR RECOVERY OF LOST AND/OR CORRUPTED DATA

(75) Inventor: Gianluigi Liva, Munich (DE)

(73) Assignee: Deutsches Zentrum fur Luft-und Raumfahrt E.v., Cologne (DE)

( * ) Notice: Subject to any disclaimer, the term of this patent is extended or adjusted under 35 U.S.C. 154(b) by 379 days.

(21) Appl. No.: 12/848,495

(22) Filed: Aug. 2, 2010

(65) Prior Publication Data

US 2011/0047445 A1 Feb. 24, 2011

(30) Foreign Application Priority Data

Aug. 4, 2009 (EP) .................................... 09167177

(51) Int. Cl.
*H03M 13/03* (2006.01)

(52) U.S. Cl.
USPC ......................................................... 714/786

(58) Field of Classification Search ................... 714/786
See application file for complete search history.

(56) References Cited

U.S. PATENT DOCUMENTS

| 6,925,502 | B1 * | 8/2005 | Abbasi et al. ................. 709/232 |
| 7,054,317 | B1 * | 5/2006 | Jung et al. .................. 370/395.1 |
| 7,366,132 | B2 * | 4/2008 | Ramakrishnan et al. ..... 370/328 |
| 2006/0026485 | A1 * | 2/2006 | Lin ............................... 714/755 |
| 2008/0175163 | A1 * | 7/2008 | Honary et al. ................ 370/252 |
| 2008/0298513 | A1 | 12/2008 | Gezici et al. |

OTHER PUBLICATIONS

Arai M. et al.; "Method to Recover Internet Packet Losses Using Conventional Codes"; Dependable Systems and Networks 2000; Jun. 25, 2000; pp. 382-389.
Arai M. et al.; "Evaluation of Convolutional-Code-Based FEC Under Limited Time and it's Application to Real-Time Transmission"; Dependable Systems and Networks 2002; Dec. 16, 2002; pp. 239-246.
Arai M. et al.; "Experiment for High-Assurance Video Conference System Over the Internet"; High Assurance Systems Engineering 2002; Oct. 23, 2002; pp. 137-142.
Arai M. et al.; "Analysis of Using Convolutional Codes to Recover Packet Losses over Burst Erasure Channels"; Dependable Computing 2001; Dec. 17, 2001; pp. 258-265.
European Search Report dated Feb. 24, 2010 for European Application No. 09167177.6.

* cited by examiner

*Primary Examiner* — Philip Guyton
(74) *Attorney, Agent, or Firm* — Ohlandt, Greeley, Ruggiero & Perle, LLP

(57) ABSTRACT

A method for recovery of lost and/or corrupted data, whereby this data is encoded by means of an encoder connected to the transmitter device and transmitted via a transmission channel to the receiver device. The transmitted data is decoded by means of a decoder connected to the receiver device wherein lost and/or corrupted data is restored during decoding. Encoding and decoding are performed by using a convolutional code. According to the disclosure the window size, on which the decoder connected to the receiver device operates, is variable so that the window size can be adapted to the erasure rate of the transmission channel and/or to the delay service requirement.

7 Claims, 4 Drawing Sheets

METHOD FOR RECOVERY OF LOST AND/OR CORRUPTED DATA

BACKGROUND

1. Field of the Disclosure

The disclosure is related to a method for recovery of lost and/or corrupted data.

2. Discussion of the Background Art

Data is transmitted from a transmitter device to a receiver device over a transmission channel. This can be done for example in the context of using satellite systems for broadcast of information to users. A broadcasting of data from a source via a satellite to several users, which all receive the same content, is organized in data packets, e.g. IP datagrams. Due to the transmission channel conditions the users will experience different bit error rates and thus packet error rates (PER). Due to the packet error rates a part of the received packets for each user will be erroneous. The packets, which are received erroneous by different users, are not necessarily the same. This scenario is illustrated in FIG. 1. In the case that a return channel or return link is not available retransmission requests cannot be sent.

A possible countermeasure is the use of so called packet loss recovery codes. The main concept of a packet loss recovery code is presented in FIG. 2. First a set of k packets to be transmitted is encoded through a packet level encoder, which produces m parity packets. The set of m+k packets is then processed by the physical layer transmitter chain. This means that the packets, both information and parity packets, are encoded via a physical layer forward error correction code, then they are modulated and transmitted. The channel impairments may cause physical layer frame errors and consequently the physical layer forward error correction code may fail in decoding a packet. This can be checked via an error detection code (e.g. CRC). Therefore from the upper layer perspective on the receiver side the packets can arrive either correctly or they are lost. The packet level decoder can then recover the missing packets by exploiting the parity packets. It can be proved that ideally it is sufficient to receive correctly k-packets out of the m+k ones to recover the full set of m+k-packets. Thus loss rates up to m:(m+k) can be tolerated.

The above mentioned method has been described taking into consideration a point to point link. When it is applied to a broadcasting scenario the number of redundant packets (parity packets) to be used has to be adapted to the user experiencing the highest packet loss rate. In other words the system designer has to derive a model of the loss rate distribution among the users and must decide about a coding rate that is able to satisfy all or at least most of them. This may lead to a loss of efficiency, since other users usually will experience lower packet loss rates.

A possible alternative to lowering too much the coding rate resides in enlarging the number of packets, on which packet level coding is applied. Usually in wireless communication systems the packet loss events are usually correlated in time, meaning that they appear in bursts. Enlarging the window, on which coding is applied, permits to average the channel behavior over a larger time. This usually leads to a reduction of the peak loss rates and thus permits to use a more efficient code scheme, namely one with less parity packets. The drawback is that latency will increase, which may not be acceptable for services with specific time requirements, for example when voice or multimedia content has to be delivered.

It is an object of the present disclosure to provide for a method for recovery of lost and/or corrupted data, which offers an improved efficiency.

SUMMARY OF THE DISCLOSURE

According to the inventive method data is transmitted from a transmitter device to a receiver device, whereby it is encoded by means of an encoder connected to the transmitter device. Data is transmitted over a transmission channel, which can be for example a broadcasting network in a satellite scenario. Any other suitable transmission channel can be used. The transmitted data is decoded by means of a decoder connected to the receiver device wherein lost and/or corrupted data are restored during decoding. Encoding and decoding is performed by using a convolutional code, whereby decoding is performed by solving the system of equations defined by the decoding matrix of the code. In particular a packet level convolutional LDPC encoder can be used.

According to the inventive method, a window size, on which the decoder connected to the receiver device operates, is variable so that it can be adapted to the erasure rate of the transmission channel and/or to the delay service requirement. Therefore the inventive method permits adaptivity at the user side meaning that each user, namely each receiver device, can decide about the tradeoff between latency and performance. In other words in an convolutional code, which comprises a "block", which is infinite, each user selects a part or a section out of this infinite sequence, on which the decoder connected to the receiver device will operate. Therefore each user can separately decide how much delay he is willing to accept, for achieving a certain error correction capability. The longer the section or the chunk, which is selected out of the infinite sequence is, the greater will be the delay and the better will be the performance of the decoder. The major advantage is that adaptivity at the user side is permitted without a requiring adapting or changing the encoding strategy at the transmitter device.

Preferably a subset of Parity Check equations is used at each decoding attempt, whereby the equations, namely the rows of the Parity Check matrix that are processed in parallel are those which involve the packets, namely the columns of the matrix, which are within a certain time interval corresponding to the latency.

It is preferred that the window, on which the decoder operates, is moved in a sliding fashion after each decoding attempt.

The inventive method is particularly suitable for systems where no return channel from the receiver device to the transmitter device is available.

The inventive method further serves for reducing the transmission overhead and the retransmission delay and makes possible a smooth definition of the tradeoff between latency and performance in a packet level broadcasting system by using an adaptive setting of the sliding window duration in accordance with quality of service requirements and/or with regard to the channel conditions.

BRIEF DESCRIPTION OF THE DRAWINGS

In the following the disclosure is described in the context of figures.

DETAILED DESCRIPTION OF THE PREFERRED EMBODIMENT

Figure 1:
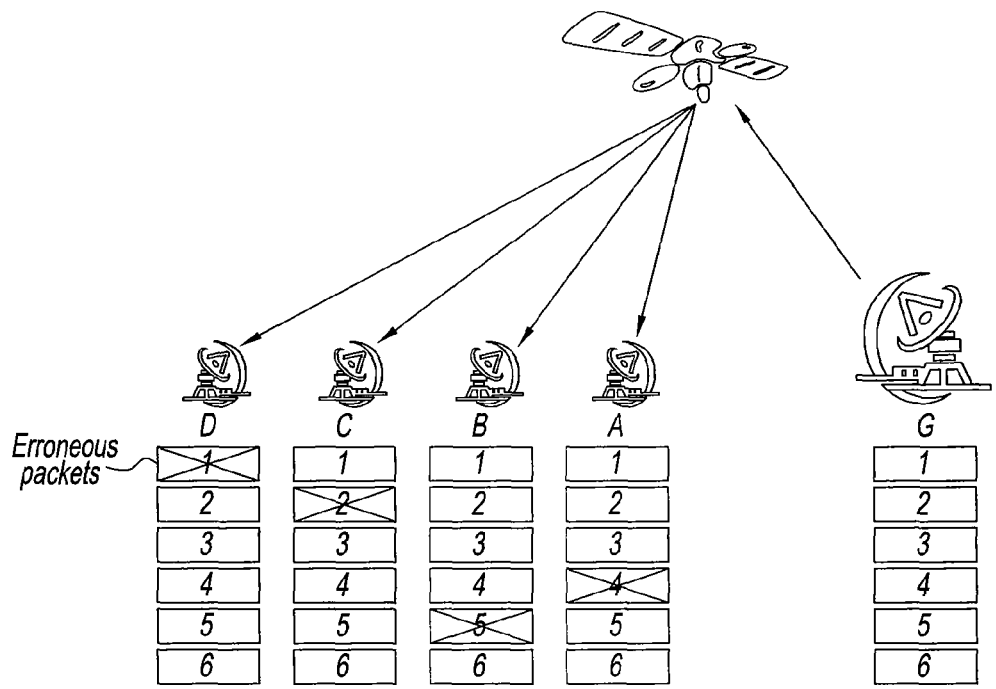
FIG. 1 shows a broadcasting scenario as it is addressed in the present application.
Figure 2:
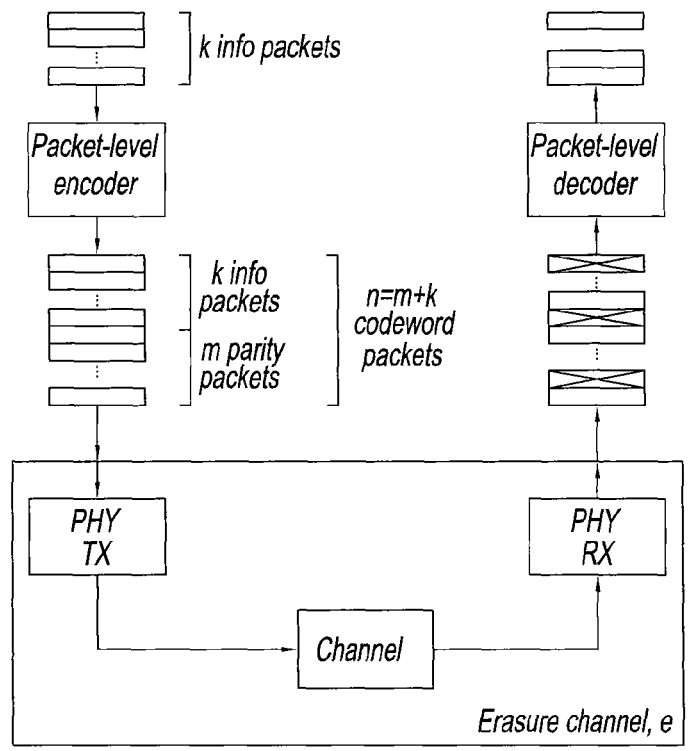
FIG. 2 shows a simplified example of packet level coding.

FIGS. 1 and 2 have been described in relation to the state of the art.

Figure 3:
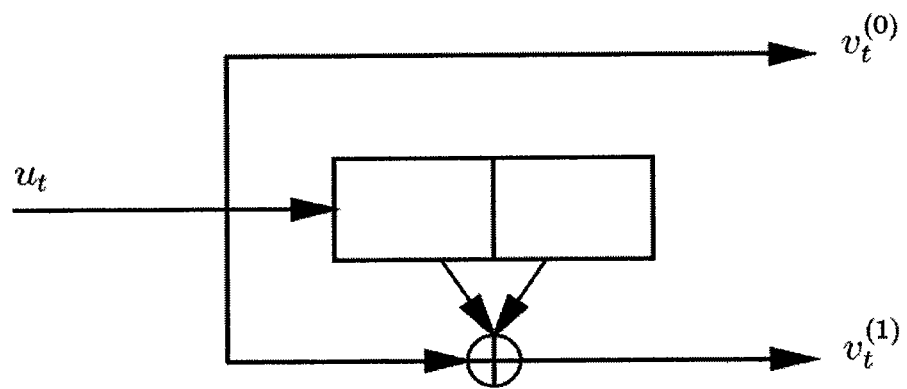
FIG. 3 shows an example of a packet level convolutional encoder.

In FIG. 3, an example of a packet-level convolutional encoder is depicted. The encoder in the example works as follows. At the time t, a packet ($u_t$) is received. The previous packet ($u_{t-1}$) is stored in a register, while in a second register the packet ($u_{t-2}$) is stored. A parity packet is then computed ($v_t^{(1)}$) as bit-wise sum of ($u_t$), ($u_{t-1}$) and ($u_{t-2}$). At the next time step (t+1), the packet ($u_{t-2}$) is removed from the second register, and it is replaced by ($u_{t-1}$), while in the first register there will be ($u_t$).

The encoding proceeds then similarly for all the time steps t, t+1, t+2, etc.

It can be shown that the parity-check matrix of the convolutional code has a banded structure as:

$$\begin{bmatrix} \ddots & \ddots & \ddots & \ddots & & & & \\ & 001 & 000 & 010 & 100 & & & \\ & 100 & 010 & 000 & 001 & & & \\ & & & 001 & 000 & 010 & 100 & \\ & & & 100 & 010 & 000 & 001 & \\ & & & & & 001 & 000 & 010 & 100 \\ & & & & & 100 & 010 & 000 & 001 \\ & & & & & & \ddots & \ddots & \ddots & \ddots \end{bmatrix}$$

In other words, the non-null elements of the parity-check matrix are all confined in a diagonal band. In case of low-density parity-check (LDPC) convolutional codes, the banded matrix is furthermore sparse (the fraction of "1" elements is small). This permits low-complexity iterative decoding with constraint lengths that are much bigger than those that can be afforded by a conventional Viterbi decoder. This results in capacity-approaching performance (e.g., low packet loss probabilities after decoding).

Figure 4:
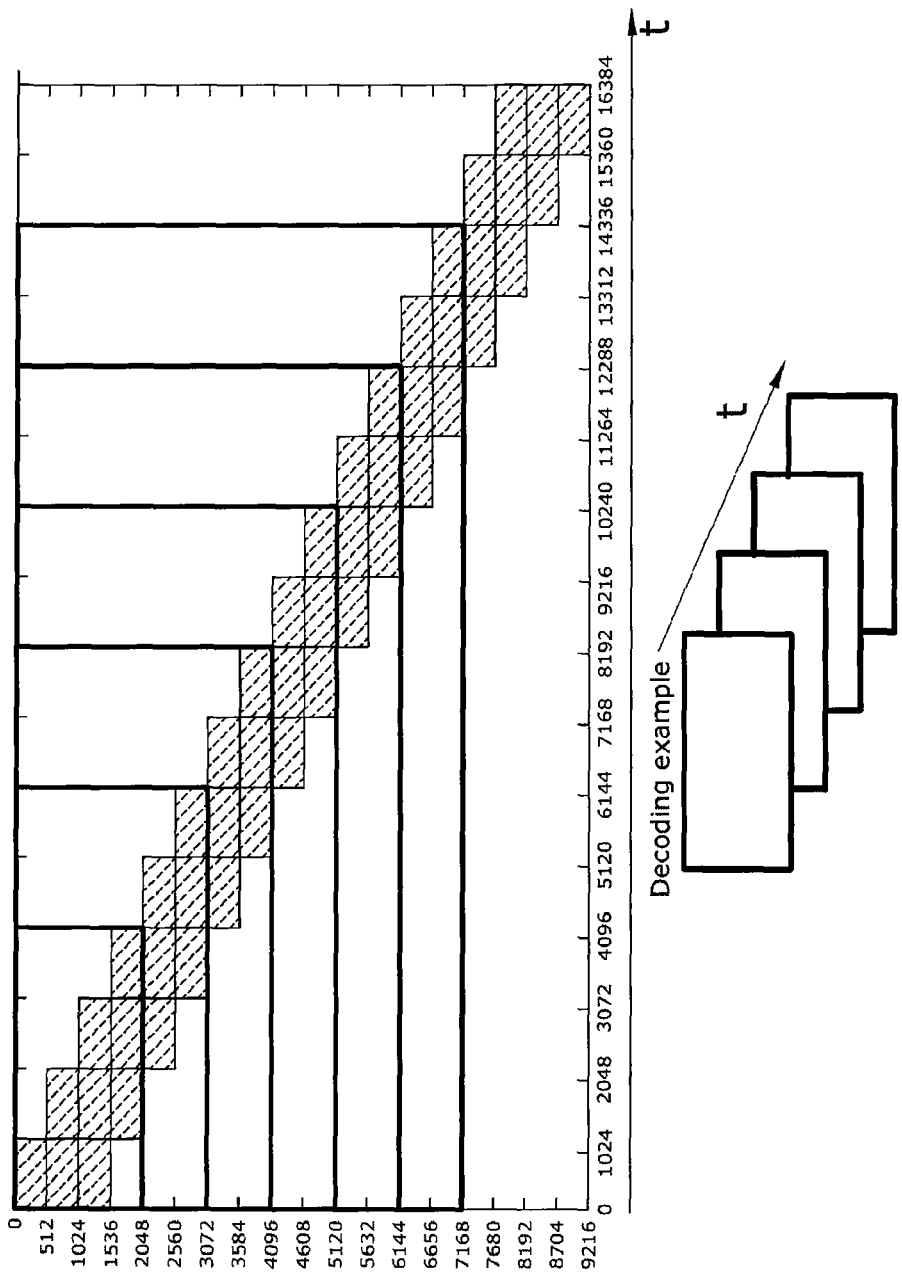
FIG. 4 shows the sliding decoding window according to the present disclosure using different decoding window sizes.

The iterative decoder is then adopted in a way that a subset of parity-check equations is used at each decoding attempt. The parity-check equations (which correspond to the rows of the parity-check matrix) that are processed in parallel are those which involve the packets (related to the columns) which are within a certain time interval (which corresponds to the latency). The larger the number of parity-check equations used within the iterative decoding attempt, the better will be the erasure recovery capability, but the higher will also be the latency. The decoding window is moved in a sliding fashion after each decoding attempt. The concept is depicted in FIG. 4, where different decoding window sizes and hence different trade-offs latency vs. performance are shown.

Figure 5:
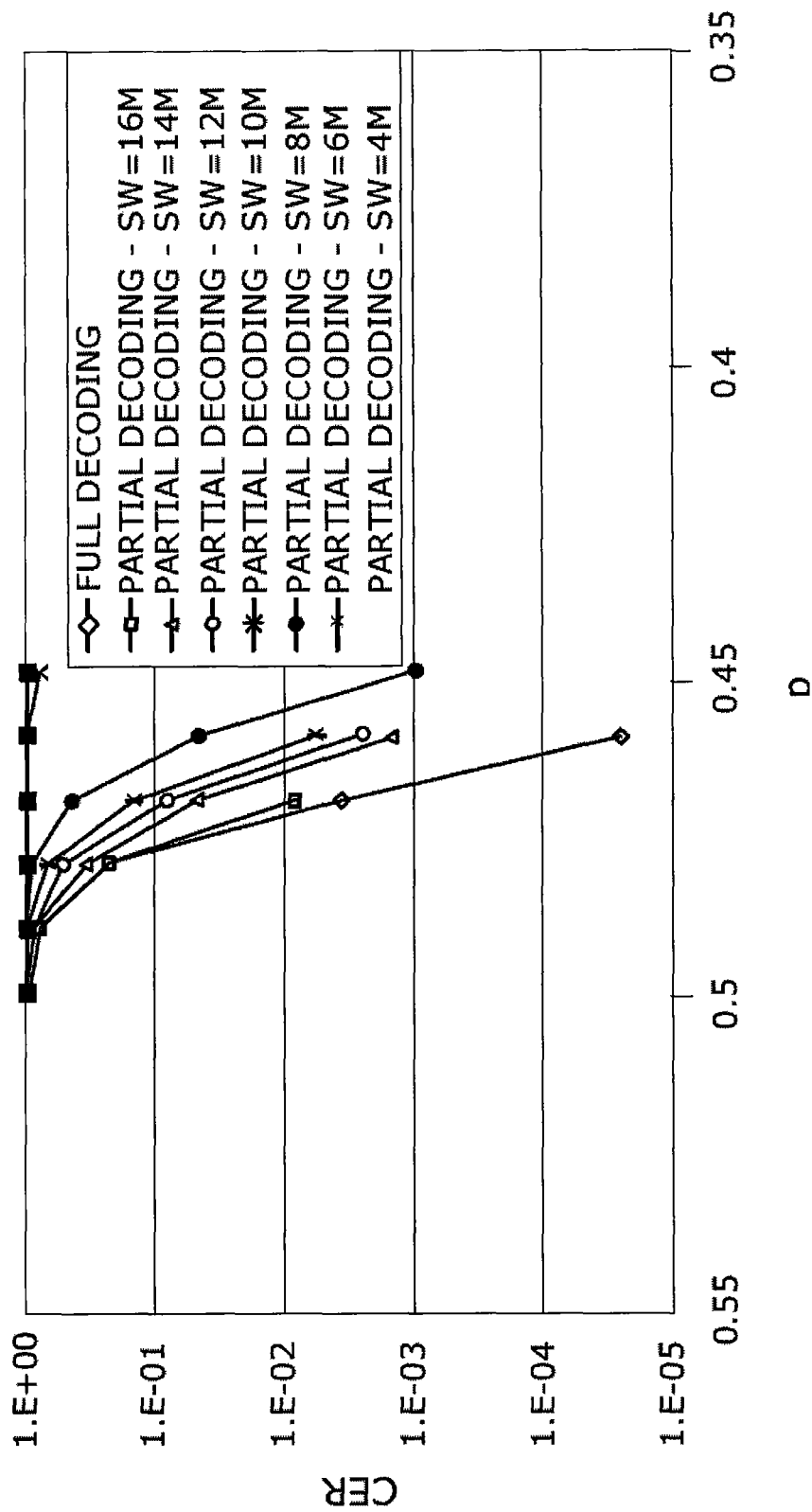
FIG. 5 shows the performance of the inventive packet level convolutional decoder.

In FIG. 5, the performance of a rate ½ convolutional LDPC decoder (meaning that k=1; k+m=2) is presented, for a channel with erasure probability p, in terms of Codeword Error Rate after decoding (namely, the probability that the decoder is not able to recover all the transmitted packets). The performance curves are presented for different decoding windows (multiple of M=1024 packets). It can be observed that a loss probability p=0.47, CER=1% can be obtained by decoding with a window of 16*M=16384 packets. By reducing the decoding latency to 8*M=8192 packets, the CER increased at ~50%.

The inventive method can be applied to all types of commercial broadcasting wireless transmission systems. As it is shown the method reduces the transmission overhead, which leads to lower costs and permits to fine tune the tradeoff between latency and performance directly at the receiver side so that the erasure correction capability can be selected individually by each receiver or user.

What is claimed is:

1. A method for recovery of lost and/or corrupted data transmitted from a transmitter device to a receiver device, said method comprising the steps of:
   coding said data by means of an encoder connected to the transmitter device,
   transmitting said data from the transmitter device to the receiver device via a transmission channel, and
   decoding said data, by a decoder connected to the receiver device, wherein lost and/or corrupted data is restored during decoding,
   whereby encoding is performed by using a convolutional code and decoding is performed by solving the system of equations defined by the decoding matrix of the code, whereby a convolutional decoder is used,
   wherein a window size on which the decoder connected to the receiver device operates is variable so that the window size can be adapted to the erasure rate of the transmission channel and/or to the delay service requirement, and further increasing the window size on which the decoder operates when the packet loss rate rises under bad channel conditions, so that the error correction capability of the decoder is improved, and decreasing the window size on which the decoder operates when the packet loss rate decreases under good channel conditions, so that the transmission delay is minimized.

2. A method according to claim 1, whereby an iterative decoder is used for decoding.

3. A method according to claim 1, wherein the convolutional encoder is a packet level convolutional LDPC encoder.

4. A method according to claim 1, wherein a subset of Parity Check equations is used at each decoding attempt, wherein the equations, namely the rows of the Parity Check matrix, that are processed in parallel are those which involve the packets, namely the columns of the matrix, which are within a certain time interval corresponding to a latency.

5. A method according to claim 1, wherein the window on which the decoder operates is moved in a sliding fashion after said decoding.

6. A method according to claim 1, wherein data is transmitted over a broadcasting network.

7. A method according to claim 1, wherein no return channel is available from the receiver device to the transmitter device.

* * * * *